United States Patent
Briseno-Vidrios et al.

(10) Patent No.: US 10,756,823 B2
(45) Date of Patent: Aug. 25, 2020

(54) LOW POWER HEARTBEAT FOR LOW POWER MODE

(71) Applicant: Silicon Laboratories Inc., Austin, TX (US)

(72) Inventors: Carlos Briseno-Vidrios, Austin, TX (US); Michael R. May, Austin, TX (US); Patrick J. de Bakker, Hollis, NH (US)

(73) Assignee: Silicon Laboratories Inc., Austin, TX (US)

( * ) Notice: Subject to any disclaimer, the term of this patent is extended or adjusted under 35 U.S.C. 154(b) by 71 days.

(21) Appl. No.: 15/975,307

(22) Filed: May 9, 2018

(65) Prior Publication Data

US 2019/0349095 A1   Nov. 14, 2019

(51) Int. Cl.
*H04B 10/80* (2013.01)
*H04L 23/00* (2006.01)
*H04B 3/00* (2006.01)
*H01L 23/00* (2006.01)
*H04B 1/40* (2015.01)
*H01L 25/16* (2006.01)

(52) U.S. Cl.
CPC .......... *H04B 10/802* (2013.01); *H01L 24/48* (2013.01); *H01L 24/49* (2013.01); *H01L 25/162* (2013.01); *H04B 1/40* (2013.01)

(58) Field of Classification Search
CPC ....... H01L 2924/00; H01L 2924/00014; H01L 2224/49175; H01L 2224/48247; H01L 23/66; H04W 52/0225; H04L 25/0268; H04L 5/14; H04B 1/40; H04B 3/32; H04B 1/04; H04B 3/542; H04B 3/56
See application file for complete search history.

(56) References Cited

U.S. PATENT DOCUMENTS

| | | | |
|---|---|---|---|
| 7,302,247 B2* | 11/2007 | Dupuis | H02M 3/33523 455/280 |
| 7,421,028 B2* | 9/2008 | Dupuis | H01L 23/66 375/258 |
| 8,643,138 B2 | 2/2014 | Dong | |
| 8,644,365 B2 | 2/2014 | Dong | |
| 8,861,229 B2 | 10/2014 | Alfano et al. | |
| 9,118,392 B2 | 8/2015 | Sundar et al. | |
| 9,923,643 B2 | 3/2018 | Dupuis et al. | |
| 2008/0267301 A1* | 10/2008 | Alfano | H01L 23/48 375/258 |
| 2009/0110206 A1* | 4/2009 | Haggis | H04W 52/0225 381/58 |

(Continued)

*Primary Examiner* — Sai Aung
(74) *Attorney, Agent, or Firm* — Zagorin Cave LLP

(57) ABSTRACT

A first die is communicatively coupled to a first isolation communication channel and a second isolation communication channel and configured to send a first heartbeat signal over the first isolation communication channel. A second die is coupled to receive the first heartbeat signal from the first die over the first isolation communication channel and to supply a second heartbeat signal to the second isolation communication channel. The first die enters a first die low power mode responsive to detecting an absence of the second heartbeat signal and the second die enters a second die low power mode responsive to detecting an absence of the first heartbeat signal. The first and second die use low power oscillators in the low power mode to supply the heartbeat signals.

18 Claims, 6 Drawing Sheets

(56) References Cited

U.S. PATENT DOCUMENTS

| | | | |
|---|---|---|---|
| 2014/0307759 A1* | 10/2014 | Sundar | H04B 1/40 375/219 |
| 2016/0100359 A1 | 4/2016 | Liu et al. | |
| 2018/0032211 A1* | 2/2018 | King | G06F 1/1694 |
| 2018/0069493 A1 | 3/2018 | Roberts | |
| 2018/0082575 A1 | 3/2018 | El-Mankabady | |

* cited by examiner

LOW POWER HEARTBEAT FOR LOW POWER MODE

BACKGROUND

Field of the Invention

This application relates to isolated circuits and more particularly to communication of heartbeat signals across isolation communication channels.

Description of the Related Art

Isolation communication channels are utilized in various applications where necessary to prevent current flow between separate isolated electric circuits while still maintaining communication between the circuits. The isolation may be required for signal isolation, safety, or for other reasons. Communication between isolated circuits has typically involved a transmitter and receiver communicating over an isolation communication channel to provide, e.g., control information between the different voltage domains. The isolation communication channels may be implemented, e.g., using capacitive, inductive, or optical isolation techniques.

SUMMARY OF EMBODIMENTS OF THE INVENTION

In an embodiment a method includes sending a first heartbeat signal from a first die to a second die across a first isolation communication channel. A second heartbeat signal is sent from the second die to the first die across a second isolation communication channel. The second die enters a first low power mode responsive to the second die detecting an absence of the first heartbeat signal.

In another embodiment, an apparatus includes a first die communicatively coupled to send a first heartbeat signal from the first die to a second die across a first isolation communication channel. The second die is communicatively coupled to send a second heartbeat signal from the second die to the first die across a second isolation communication channel. The second die enters a first low power mode responsive to the second die detecting an absence of the first heartbeat signal.

In another embodiment, an apparatus includes a first die communicatively coupled to a first isolation communication channel and a second isolation communication channel and configured to send a first heartbeat signal over the first isolation communication channel. A second die is coupled to receive the first heartbeat signal from the first die over the first isolation communication channel and to supply a second heartbeat signal to the second isolation communication channel. A first heartbeat signal detector circuit on the first die detects the second heartbeat signal sent from the second die to the first die across the second isolation communication channel. A second heartbeat signal detector circuit on the second die detects the first heartbeat signal sent to the second die from the first die across the first isolation communication channel. The first die enters a first die low power mode responsive to detecting an absence of the second heartbeat signal and the second die enters a second die low power mode responsive to detecting an absence of the first heartbeat signal.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
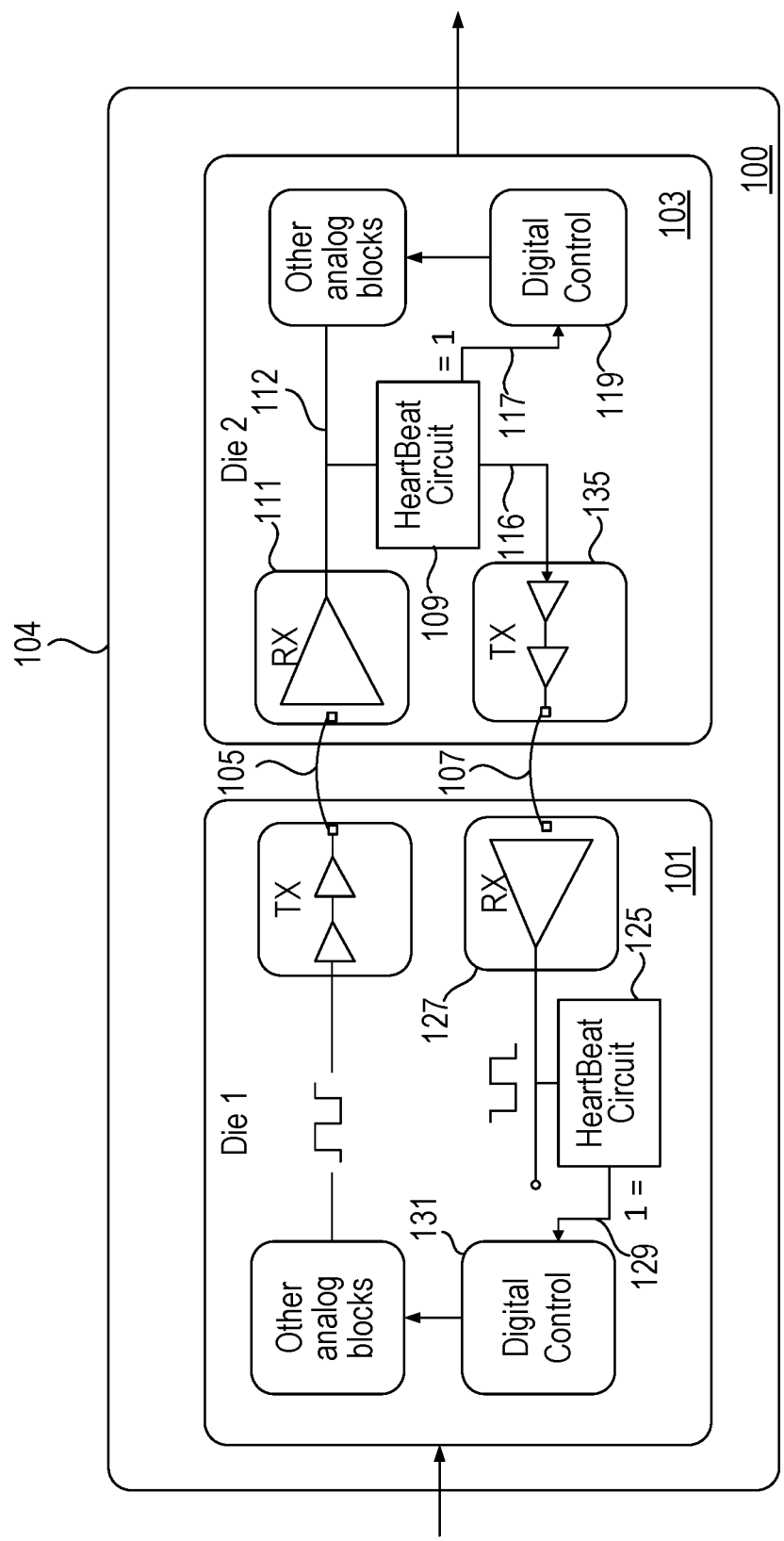
FIG. 1 illustrates an isolation system with two die and two isolation communication channels.

FIG. 1 illustrates an isolation system 100 with a first integrated circuit die 101 and a second integrated circuit die 103 mounted in package 104. The first die 101 transmits information over the isolation communication channel 105 to the second die 103 and the second die 103 transmits information over the isolation communication channel 107 to the first die 101. Embodiments described herein may utilize various approaches to isolation such as inductive coupling, using, capacitive couplers, or optical couplers. Thus, the physical implementation of the isolation communication channels may differ in different embodiments.

Embodiments described herein send heartbeat signals through the isolation communication channels so each die knows if the other die is operating in a normal mode. The absence of the heartbeat signal can indicate that the power supply has been lost in one die or another failure has occurred preventing transmission of the heartbeat signal. That allows the die detecting the absence of the heartbeat signal to go into a low power mode that is described further herein until correct functionality can be restored on the die that lost power. That saves power that would otherwise be expended.

Referring still to FIG. 1, the heartbeat circuit 109 measures the output of the isolation communication channel receiver circuit 111 to detect the presence or absence of the heartbeat signal. The heartbeat circuit 109 sends a flag 117, which indicates the status of the heartbeat signal, to the digital control logic 119. The digital control logic 119 places die 103 in a low power mode when indicated by the flag. In an embodiment, the heartbeat circuit 109 sets the heartbeat flag 117 to "one" if the heartbeat circuit detects heartbeat signals crossing the isolation communication channel and to "zero" if the heartbeat circuit detects the absence of the heartbeat signal.

Figure 2:
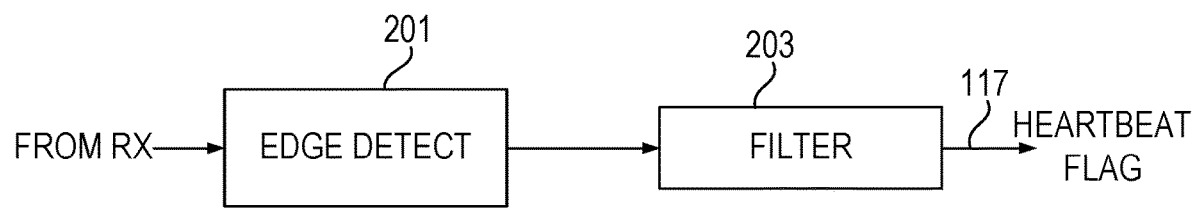
FIG. 2 illustrates an embodiment of a portion of the heartbeat circuit that detects the heartbeat signal and supplies a flag indicating whether the heartbeat signal has been detected.

FIG. 2 illustrates an embodiment of a portion of the heartbeat circuit that detects the heartbeat signal from die 1 and supplies the flag 117 to indicate whether the heartbeat has been detected. The detector portion of the heartbeat signal includes an edge detect circuit 201 that detects an edge in a conventional manner and uses a filter 203 to determine when the edge detect is valid. In an embodiment, the filter is a counter and the flag is asserted to indicate detection of a heartbeat signal, and if the counter reaches a maximum (or minimum) value before a next edge is detected, the flag 117 deasserts to indicate absence of the inbound heartbeat signal. In other embodiments, the filter 203 uses analog components like resistors, capacitors and a comparator to implement the filter function. In a simple example, if die 101 loses its power supply, the heartbeat circuit on die 103 detects the absence of a heartbeat signal crossing the isolation communication channel 105, therefore, the counter 203 reaches its maximum or minimum value and the flag goes to zero. The digital control logic 119 sees the flag deasserted and turns off analog circuits in die 103 not needed for operation in low power mode until the power supply on die 101 returns. Note that other failures besides loss of power on die 101 may result in an absence of the heartbeat signal provided to die 103. The digital control logic can be implemented using a programmed microcontroller, digital logic gates with storage elements such as registers or flip-flops to implement state machines or other control functionality, or any appropriate combination of logic gates, storage elements, and programmed microcontroller to implement the needed functions described herein.

Referring to FIG. 1, die 101 includes a heartbeat circuit 125 that detects if die 103 has lost its power supply based on absence of a detected heartbeat signal. The heartbeat circuit 125 measures the output of the isolation communication channel receiver circuit 127. The heartbeat circuit 125 sends a flag 129 to the digital control logic 131, which can place die 101 into a low power mode. In an embodiment, the heartbeat circuit 125 sets heartbeat flag 129 to a "one" if the heartbeat circuit detects heartbeat signals crossing the isolation communication channel 107 and to "zero" if the heartbeat circuit 125 detects the absence of the heartbeat signal. The heartbeat circuit 125 can include the example circuitry shown in FIG. 2 to detect the heartbeat signal transmitted across the isolation communication channel 107. In a simple example, if die 103 loses its power supply the heartbeat circuit 125 on die 101 detects the absence of the heartbeat signal crossing the isolation communication channel 107, therefore, the flag 129 deasserts. The digital control logic 131 turns off analog circuits in die 101 not needed in low power mode until the power supply on die 103 returns. Note that other conditions on die 103 may result in an absence of the heartbeat signal provided to die 101.

Figure 3:
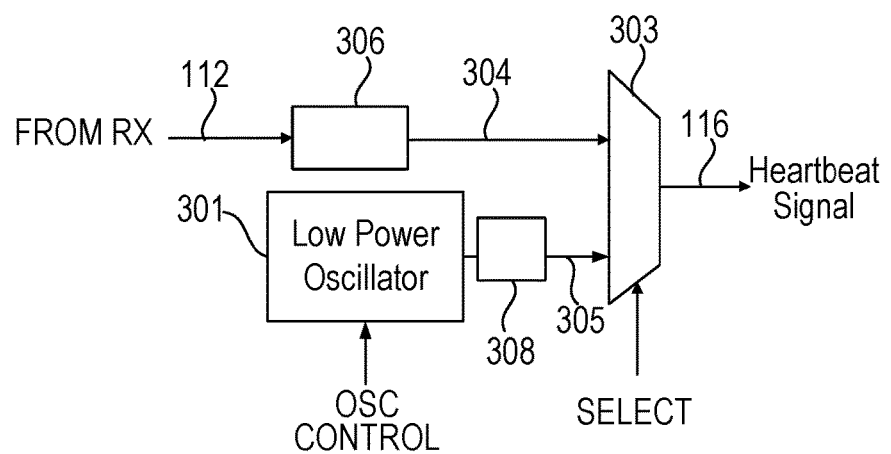
FIG. 3 illustrates another aspect of the heartbeat circuit that uses an oscillator in a low power mode to generate the heartbeat signal.

FIG. 3 illustrates another aspect of the heartbeat circuit 109 (and 125). The heartbeat circuit includes a low power oscillator 301 and a selector circuit 303. In a normal operational mode, die 2 wraps the RX derived signal 304 derived from the received heartbeat signal received in receiver 111 back to transmitter 135 as the heartbeat signal from die 2. The heartbeat signal from die 1 may be control information/data used to control one or more devices on the die 2 side. For example, die 1 may be a low voltage side and die 2 may be the high voltage side and the information sent over the isolation communication channel 105 may be used to control high voltage device(s) coupled to die 2. The RX derived signal 304 may be derived directly from receiver signal 112 or modified in block 306, e.g., in magnitude, power, phase, frequency, error protocol, or otherwise modified appropriately for transmission across the isolation communication channel. Thus, in normal operational mode selector circuit selects the RX derived signal 304 as the heartbeat signal. However, in low power mode the control logic 119 associated with the heartbeat function turns on low power oscillator 301. Low power oscillator 301 may be implemented, e.g., as a ring oscillator with a frequency of tens of MHz. Of course, other frequencies and types of oscillators may be utilized according to the technology utilized and frequency desired. In low power mode selector circuit selects oscillator signal 305, or a signal derived therefrom in block 308, as the heartbeat signal 116. When the oscillator signal is the source of the heartbeat signal, the oscillator signal may be modified in block 308, e.g., in phase, frequency, duty cycle, or otherwise modified as appropriate for transmission across the isolation communication. In embodiments, the oscillator derived heartbeat signal 305 is derived directly from the oscillator signal without any modification in block 306 and the heartbeat signal is modified only as needed for transmission across the isolation communication channel. Use of the oscillator in low power mode allows die 1 to still see a heartbeat signal from die 2 when die 2 is in low power mode and when die 1 recovers to an operational status, die 1 recognizes that die 2 is healthy based on the received heartbeat signal and the system can resume normal operation.

In an embodiment, the digital control logic 119 provides control functionality to turn on oscillator 301 responsive to the flag 117 deasserting and controls the selection of selector circuit 303 according to whether die 2 is in low power mode. In an embodiment, the low power mode lasts indefinitely until the other die returns to a normal operational status.

Figure 4:
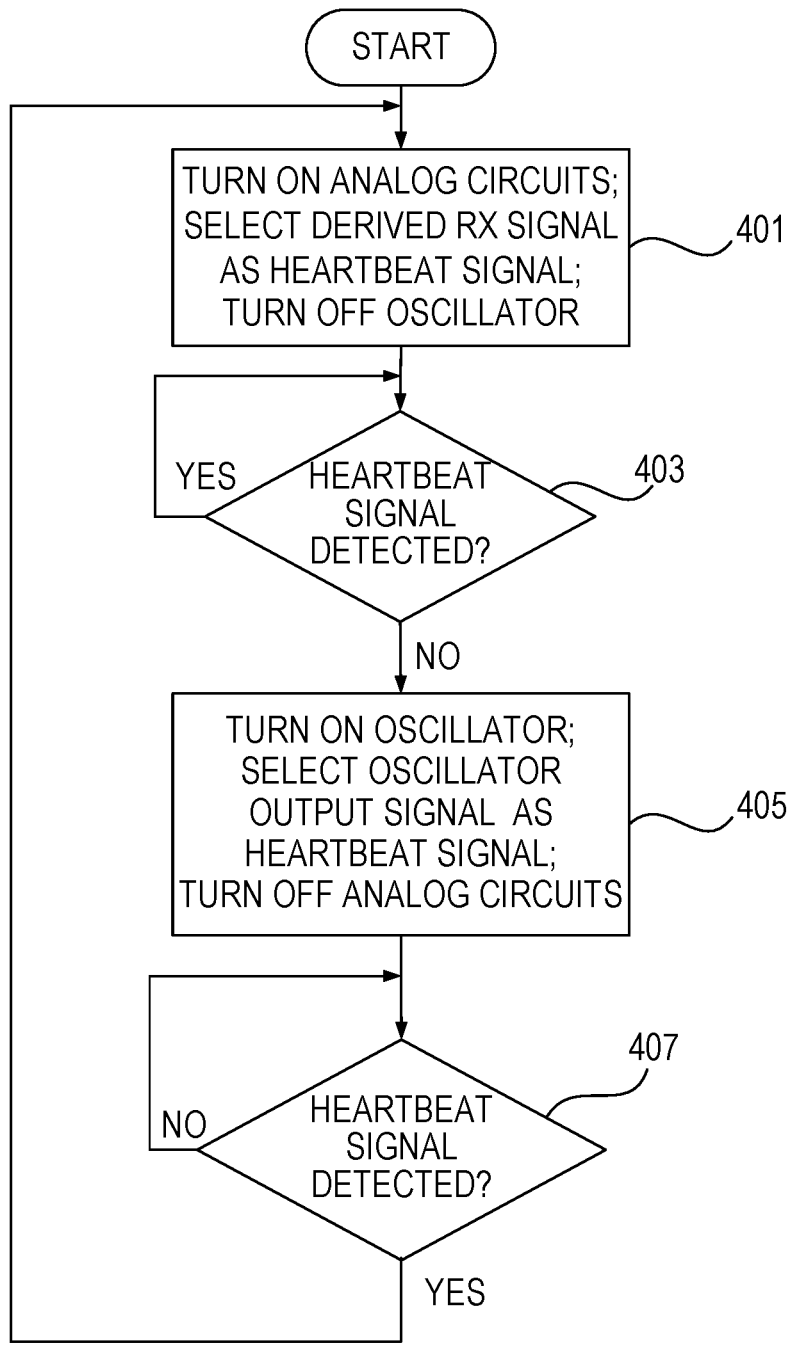
FIG. 4 illustrates a high level flow diagram of control logic to implement aspects of the heartbeat functionality.

FIG. 4 illustrates a high level flow diagram of control logic 119 in die 103 to control the heartbeat functionality. In 401, the control logic turns on the analog circuits as needed, selects as the heartbeat signal the RX derived signal 304 derived from the receiver signal 112, and turns off the oscillator (or keeps the oscillator off after a power on reset). The selection of the RX derived signal as the heartbeat signal may be a default condition on power up. In 403, the control logic checks for detection of the heartbeat signal. If the heartbeat signal is detected (YES in 403), the control logic returns to 403 to keep checking for the heartbeat signal. If the heartbeat signal is not detected (NO in 403), the control logic turns on oscillator 301 in 405 and causes the selector circuit 303 to select the oscillator signal or a signal derived therefrom as the heartbeat signal. The control logic also turns off analog and/or digital circuits not needed to detect the heartbeat signal from the other die or transmit the heartbeat signal to the other die and any other circuits not needed for operation of the die. The control logic then checks in 407 for the heartbeat signal from the other die. If the heartbeat signal returns, indicating the other die has resumed functioning (for example, regained power), then the control logic returns to 401 to turn on any analog/digital circuits that have been turned off, select the RX derived signal 304 as the heartbeat signal, and turn off the oscillator.

Figure 5:
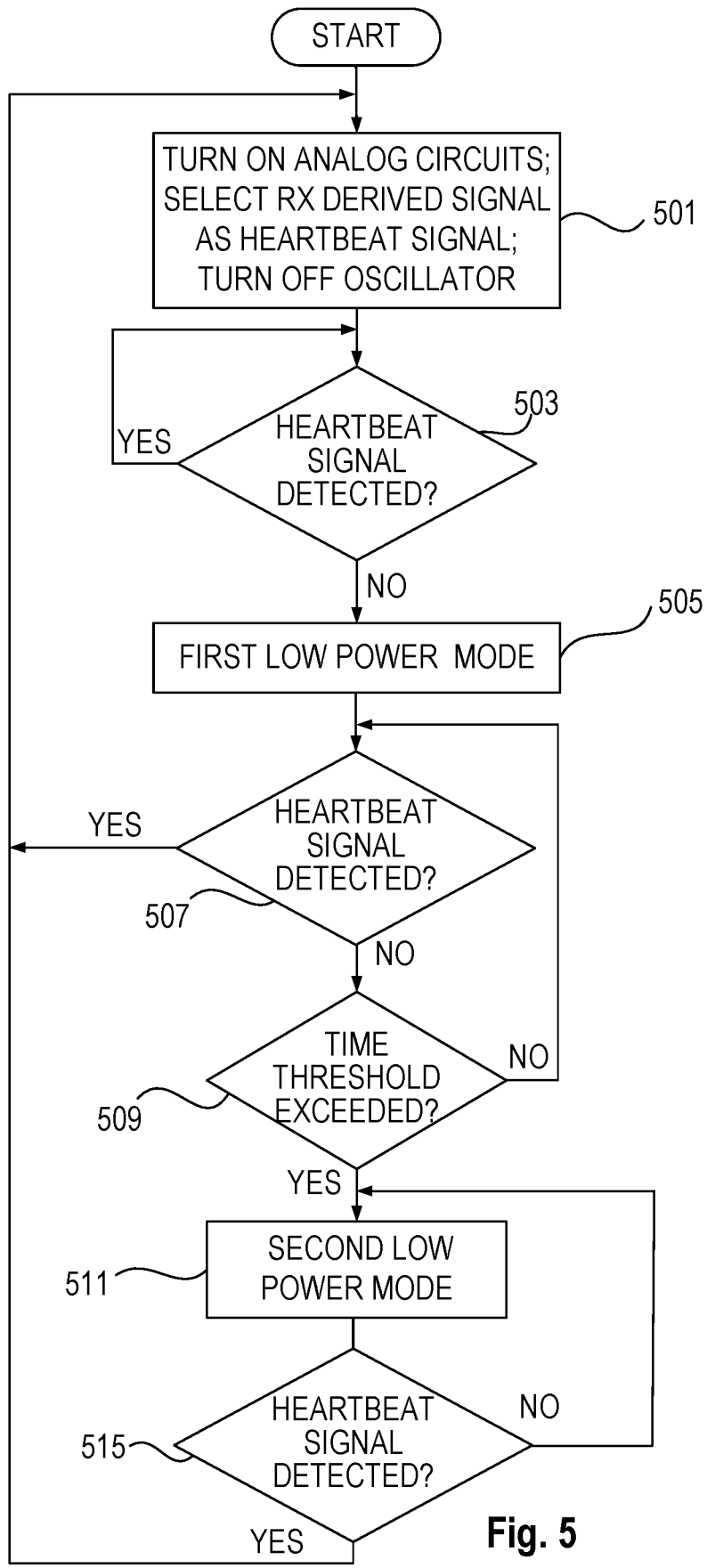
FIG. 5 illustrates a flow chart for an embodiment that utilizes multiple low power modes.

In an embodiment, a second low power mode may be entered that consumes even less power. In an embodiment, the die enters the first low power mode for a period of time and then, after the expiration of that time period, enters a second low power mode that consumes less power than the first low power mode. FIG. 5 illustrates a flow chart for an embodiment that utilizes multiple low power modes. In 501, the control logic turns on analog circuits as needed, selects the RX derived signal 304 as the heartbeat signal and turns off the oscillator (or keeps the oscillator off after a power on reset). The selection of the RX derived signal 304 may be a default condition on power up. In 503, the control logic checks if the heartbeat signal is detected. If the heartbeat signal is detected (YES in 503), the control logic remains in the normal operational state checking in 503 if the heartbeat signal status changes. If the absence of the heartbeat signal is detected (NO in 503), the control logic enters the first low power mode in 505 in which oscillator 301 turns on, the selector circuit 303 selects the oscillator signal or a derivation therefrom as the heartbeat signal, and the control logic turns off analog/digital circuits not needed to detect the heartbeat signal from the other die or transmit the heartbeat signal to the other die. The control logic then checks in 507 for the heartbeat signal from the other die. If the heartbeat signal returns, indicating the other die has resumed functioning (e.g., regained power), then the control logic returns to 501 to turn on any analog/digital circuits that had been turned off in the first low power mode, select the RX derived signal as the heartbeat signal, and turn off the oscillator. If the heartbeat signal was not detected in 507, the control logic checks in 509 to see if the time threshold to remain in the first low power mode has been reached. If not, the flow returns to check if the heartbeat signal was detected in 507. If the time threshold was exceeded in 509, the die enters the second low power mode 511.

The second low power mode uses less power than the first low power mode. One way that is achieved is that the control logic turns off oscillator 301 (see FIG. 3) for a period of time along with the receiver 111 (see FIG. 1). Other functionality, such as edge detect circuit 201 and filter 203 (see FIG. 2) can be powered down as well. The more of the die that is powered down, the more additional power savings achieved in the second low power mode. After a period of time, the control logic turns on receiver 111 and needed circuits to look for the heartbeat signal from the other die and turns on the oscillator 301. For example, the controller can turn on the oscillator, and receiver, and associated circuits every 100 µs for 10 µs. The particular duty cycle can be selected to match the desired power savings. During the portion of the duty cycle in which the heartbeat circuits are functioning, the die looks for a heartbeat signal from the other die in 515. If the heartbeat flag was not asserted, the die remains in the second low power mode 511, periodically waking up, transmitting a heartbeat signal and checking to see if a heartbeat signal was received from the other die. While FIG. 5 describes first and second low power modes, other embodiments can have additional low power modes where the duty cycle varies or frequency of turning on varies. Such features can be programmable.

Figure 6:
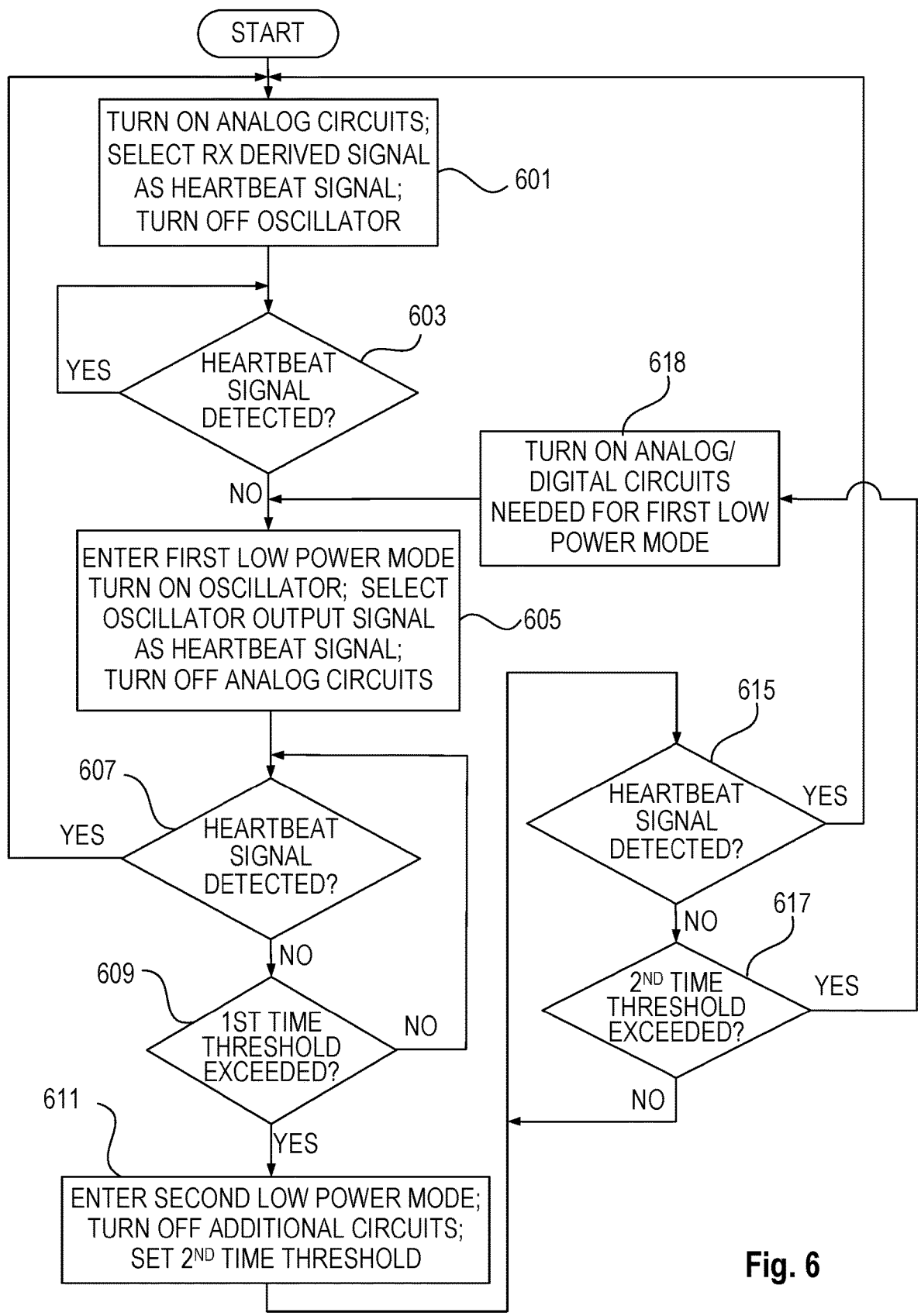
FIG. 6 illustrates a flow chart for another embodiment that utilizes multiple low power modes.

FIG. 6 illustrates another embodiment with multiple low power modes. In 601, the control logic turns on analog circuits as needed, selects the RX derived signal 304 as the heartbeat signal, and turns off the oscillator (or keeps the oscillator off after a power on reset). The selection of the RX derived signal 304 may be a default condition on power up. In 603, the control logic checks if the heartbeat signal is detected. If the heartbeat signal is detected (YES in 603), the control logic remains in the normal operational state checking in 603 if the heartbeat signal status changes. If the absence of the heartbeat signal is detected (NO in 603), the control logic enters the first low power mode in 605 in which oscillator 601 turns on, the selector circuit 303 selects the oscillator signal or a derivation therefrom as the heartbeat signal, and the control logic turns off analog/digital circuits not needed to detect the heartbeat signal from the other die or transmit the heartbeat signal to the other die. The control logic then checks in 607 for the heartbeat signal from the other die. If the heartbeat signal returns, indicating the other die has resumed functioning (e.g., regained power), then the control logic returns to 601 to turn on any analog/digital circuits that had been turned off in the first low power mode, select the RX derived signal as the heartbeat signal, and turn off the oscillator. If the heartbeat signal was not detected in 607, the control logic checks in 609 to see if the time threshold to remain in the first low power mode has been reached. If not, the flow returns to check if the heartbeat signal was detected in 607. If the first time threshold was exceeded in 609, the die enters the second low power mode 611.

The second low power mode uses less power than the first low power mode. One way that is achieved is that the control logic turns off oscillator 301 (see FIG. 3) for a period of time along with the receiver 111 (see FIG. 1). Other functionality, such as edge detect circuit 201 and filter 203 (see FIG. 2) can be powered down as well. The more of the die powered down, the more additional power savings achieved in the second low power mode. The control logic sets a second time threshold to remain in the lower power state. In 615 the control logic checks if the heartbeat signal was detected. If so, the control logic returns to 601. If no heartbeat signal was detected, the control logic checks to see if the second time threshold has expired. If not (NO in 617) the control logic returns to 615 to check for the heartbeat signal. If YES in 617 the control logic turns on analog/digital circuits turned off in the second low power mode and needed for the first low power mode in 618 and goes to 605 to turn on the oscillator, and select the oscillator output signal, or a signal derived therefrom, as the heartbeat signal. The control logic remains in the first low power mode for the first time threshold and then transitions to the second low power mode for a second time threshold until a heartbeat signal is detected. Embodiments may utilize a third time threshold to turn power off permanently if the heartbeat signal does not return in the third time threshold.

Note that in embodiments, die 101 and die 103 are identical and thus any description of the operation of die 101 applies to die 103 and vice versa. In other embodiments, the dies are different. The particular utilization of the two dies can vary based on the application in which they are used.

Figure 7:
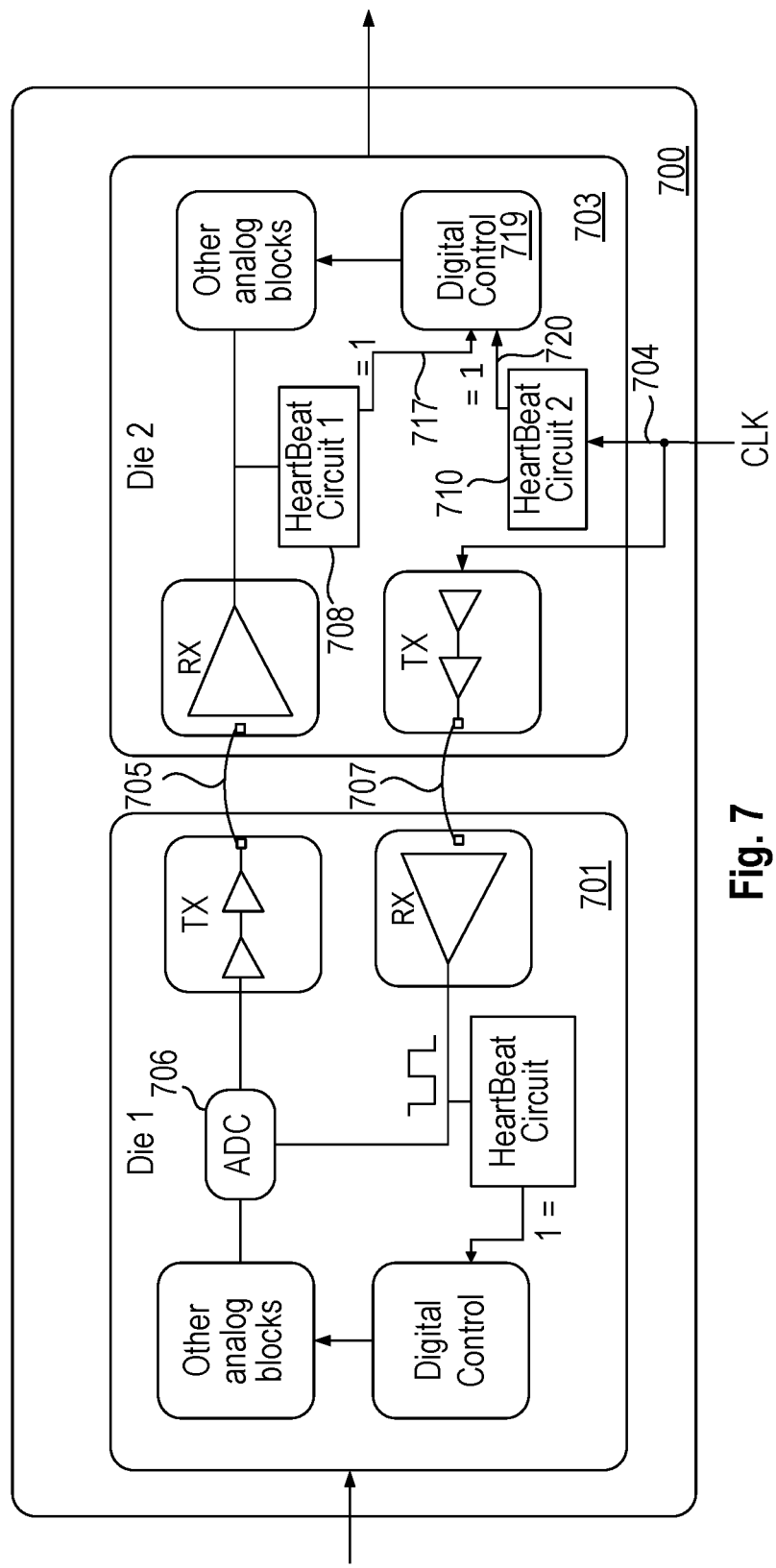
FIG. 7 illustrates an embodiment in which one of the die receives a clock signal and supplies that clock signal as the heartbeat signal, which is used by the die receiving the heartbeat signal to clock an analog to digital converter.

FIG. 7 illustrates an embodiment 700 with die 1 701 and die 2 703. In the illustrated embodiment, die 2 703 receives a clock signal 704 and supplies that clock signal or a signal derived therefrom to die 1 over isolation communication channel 707 as the heartbeat signal. The heartbeat signal may be modified, e.g., in frequency, phase and/or duty cycle from the clock signal 704. In an embodiment, die 1 uses the heartbeat signal from die 2 signal to clock an analog to digital converter (ADC) 706 located on die 1. The ADC converts a received analog signal on die 1 to a digital signal for transmission across the isolation communication channel 705. Die 2 detects two different heartbeat signals. Heartbeat circuit 1 708 detects as the first heartbeat signal the functional signal transmitted from die 1 to die 2 across isolation communication channel 705 and supplies flag 717 to digital control logic 719. Heartbeat circuit 2 710 detects the clock signal 704 as the second heartbeat signal and supplies the heartbeat flag 720 to digital control logic 719. In operation die 2 does not send a heartbeat signal to die 1 if clock signal 704 stops. That will cause die1 to enter into a low power mode. Thus, the activity on clock signal 704 can be used as a control signal to die 1 to enter into a low power state. Also, the heartbeat signal from die1 to die2 can be used to indicate to die 2 that die1 has no power, and thus die 2 can power down since the system is not in normal functioning mode when die1 doesn't have power. Clock signal 704 can also be used to cause die 2 to enter into a low power state. Various alternate embodiments can be chosen based on the requirements of the application. The embodiment discussed above with respect to FIG. 7 is only one implementation choice within the scope of the invention.

Thus, various aspects have been described relating to use of heartbeat signals in an isolated system. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method comprising:
sending a first heartbeat signal from a first die to a second die across a first isolation communication channel;
sending a second heartbeat signal from the second die to the first die across a second isolation communication channel;
the second die entering a first low power mode responsive to the second die detecting an absence of the first heartbeat signal;
the second die deriving the second heartbeat signal from the first heartbeat signal in a regular power mode;
the second die turning on an oscillator to generate an oscillator signal as part of entering the first low power mode; and
the second die deriving the second heartbeat signal from the oscillator signal in the first low power mode.

2. The method, as recited in claim 1, further comprising:
the first die entering a first die low power mode responsive to detecting an absence of the second heartbeat signal.

3. The method, as recited in claim 1, further comprising:
the second die detecting the absence of the first heartbeat signal based on a lack of transitions in the first heartbeat signal.

4. The method, as recited in claim 1, further comprising:
the second die turning off circuits as part of entering the first low power mode.

5. The method, as recited in claim 1, further comprising:
the second die entering the first low power mode for a first time period; and
the second die entering a second low power mode in which less power is consumed than the first low power mode, responsive to expiration of the first time period.

6. The method, as recited in claim 5, further comprising:
in the second low power mode, the second die periodically listening for the first heartbeat signal.

7. A method comprising:
sending a first heartbeat signal from a first die to a second die across a first isolation communication channel;
sending a second heartbeat signal from the second die to the first die across a second isolation communication channel;
the second die entering a first low power mode responsive to the second die detecting an absence of the first heartbeat signal;
the second die receiving a first clock signal from an external source;
the second die generating the second heartbeat signal based on the first clock signal;
the second die entering the first low power mode responsive to detecting an absence of the first clock signal; and
the second die not supplying the second heartbeat signal to the first die in the first low power mode responsive to detecting the absence of the first clock signal.

8. The method, as recited in claim 7, further comprising:
the first die clocking an analog to digital converter in the first die using a second clock signal derived from the second heartbeat signal.

9. An apparatus comprising:
an oscillator;
a first die communicatively coupled to send a first heartbeat signal from the first die to a second die across a first isolation communication channel;
the second die is communicatively coupled to send a second heartbeat signal from the second die to the first die across a second isolation communication channel;
wherein the second die enters a first low power mode responsive to the second die detecting an absence of the first heartbeat signal;
wherein the second die turns on the oscillator to generate an oscillator signal from which the second heartbeat signal is derived in the first low power mode; and
wherein the second die derives the second heartbeat signal from the first heartbeat signal in a regular power mode.

10. The apparatus, as recited in claim 9, wherein the first die enters a first die low power mode responsive to detecting an absence of the second heartbeat signal.

11. The apparatus, as recited in claim 9, wherein the first die is configured to send functional data across the first isolation communication channel as the first heartbeat signal.

12. The apparatus, as recited in claim 9, wherein the second die further comprises:
a transition detector circuit to detect the absence of the first heartbeat signal based on a lack of transitions in the first heartbeat signal.

13. The apparatus, as recited in claim 9, wherein the second die further comprises:
a timer circuit to measure a first time period;
wherein the second die enters the first low power mode for the first time period; and
wherein the second die enters a second low power mode in which less power is consumed than the first low power mode, responsive to expiration of the first time period.

14. The apparatus, as recited in claim 13, wherein in the second low power mode, the second die does not listen for the first heartbeat signal for at least a portion of the second low power mode.

15. An apparatus comprising:
a first die communicatively coupled to send a first heartbeat signal from the first die to a second die across a first isolation communication channel;
the second die is communicatively coupled to send a second heartbeat signal from the second die to the first die across a second isolation communication channel;
wherein the second die enters a first low power mode responsive to the second die detecting an absence of the first heartbeat signal;
wherein the second die is coupled to receive a first clock signal from an external source;
wherein the second die is configured to derive the second heartbeat signal from supply the first clock signal;
wherein the second die is responsive to enter the first low power mode if the second die detects an absence of the first clock signal; and
the second die does not supply the second heartbeat signal to the first die in the first low power mode responsive to detecting the absence of the first clock signal.

16. The apparatus, as recited in claim 15,
wherein the first die includes an analog to digital converter coupled to use a second clock signal derived from the second heartbeat signal.

17. An apparatus comprising:
a first die communicatively coupled to a first isolation communication channel and a second isolation communication channel and configured to send a first heartbeat signal over the first isolation communication channel;
a second die coupled to receive the first heartbeat signal from the first die over the first isolation communication channel and to supply a second heartbeat signal to the second isolation communication channel;
a first heartbeat signal detector circuit on the first die to detect the second heartbeat signal sent from the second die to the first die across the second isolation communication channel; and
a second heartbeat signal detector circuit on the second die to detect the first heartbeat signal sent to the second die from the first die across the first isolation communication channel;
wherein the first die enters a first die low power mode responsive to detecting an absence of the second heartbeat signal;
wherein the second die enters a second die low power mode responsive to detecting an absence of the first heartbeat signal;
an oscillator providing an oscillator output signal, the oscillator being turned on in the second die low power mode;
wherein the second die derives the second heartbeat signal from the oscillator output signal in the second die low power mode; and
wherein the second die derives the second heartbeat signal from the first heartbeat signal in a normal operational mode.

18. The apparatus, as recited in claim 15, further comprising:
a first heartbeat signal detector circuit on the first die to detect the second heartbeat signal;
a second heartbeat signal detector circuit on the second die to detect the first heartbeat signal; and
a third heartbeat detector circuit on the second die coupled to detect the first clock signal supplied to the second die from which the second heartbeat signal is derived and wherein the second die is responsive to enter the first low power mode responsive to the third heartbeat detector circuit detecting the absence of the first clock signal.

\* \* \* \* \*

UNITED STATES PATENT AND TRADEMARK OFFICE
CERTIFICATE OF CORRECTION

PATENT NO. : 10,756,823 B2
APPLICATION NO. : 15/975307
DATED : August 25, 2020
INVENTOR(S) : Carlos Briseno-Vidrios, Michael R. May and Patrick J. de Bakker It is certified that error appears in the above-identified patent and that said Letters Patent is hereby corrected as shown below:

In the Specification

In Column 2, Line 39, please replace "using," with --using--;
In Column 8, Line 59, please remove "supply".

Signed and Sealed this
Twentieth Day of October, 2020

Andrei Iancu
*Director of the United States Patent and Trademark Office*